United States Patent [19]
Fukuhara et al.

[11] 3,945,698
[45] Mar. 23, 1976

[54] METHOD OF STABILIZING EMITTED ELECTRON BEAM IN FIELD EMISSION ELECTRON GUN

[75] Inventors: Satoru Fukuhara, Kokubunji; Shigehiko Yamamoto, Tokorozawa; Hiroshi Okano, Tokyo, all of Japan

[73] Assignee: Hitachi, Ltd., Japan

[22] Filed: Oct. 7, 1974

[21] Appl. No.: 512,925

[30] Foreign Application Priority Data
Oct. 5, 1973 Japan............................. 48-111457

[52] U.S. Cl................................. 316/26; 148/20.3
[51] Int. Cl.²............................................ H01J 9/00
[58] Field of Search............... 29/25.1, 25.11, 25.17, 29/25.18; 316/17–22, 24, 26, 1; 219/121 EM; 148/20.3, 13, 13.1

[56] References Cited
UNITED STATES PATENTS

| | | | |
|---|---|---|---|
| 2,679,570 | 5/1954 | Cisne | 219/68 |
| 2,786,955 | 3/1957 | Trolan | 313/148 |
| 2,817,002 | 12/1957 | Dyke et al. | 316/26 X |
| 2,916,668 | 12/1959 | Dyke et al. | 316/26 X |
| 3,763,346 | 10/1973 | Drechsler | 219/121 EM |
| 3,795,837 | 3/1974 | Chang | 316/28 |
| 3,817,592 | 6/1974 | Swanson | 316/26 |

OTHER PUBLICATIONS

Dyke et al., "Electrical Stability and Life of the Heated Field Emission Cathode," *Journal of Applied Physics*, Vol. 31, May 1960, pp. 790–805.

*Primary Examiner*—Roy Lake
*Assistant Examiner*—James W. Davie
*Attorney, Agent, or Firm*—Craig & Antonelli

[57] ABSTRACT

A stabilizing method is provided wherein a field emission cathode is subject to heat treatment of 2,000°C. to 3,000°C. in a hydrogen gas atmosphere of $1 \times 10^{-9}$ Torr to $5 \times 10^{-7}$ Torr and hereinafter an electric field in excess of $10^7$ volt/cm is applied to the cathode, whereby the emitted electron beam current from the cathode can be maintained constant for a long time.

10 Claims, 3 Drawing Figures

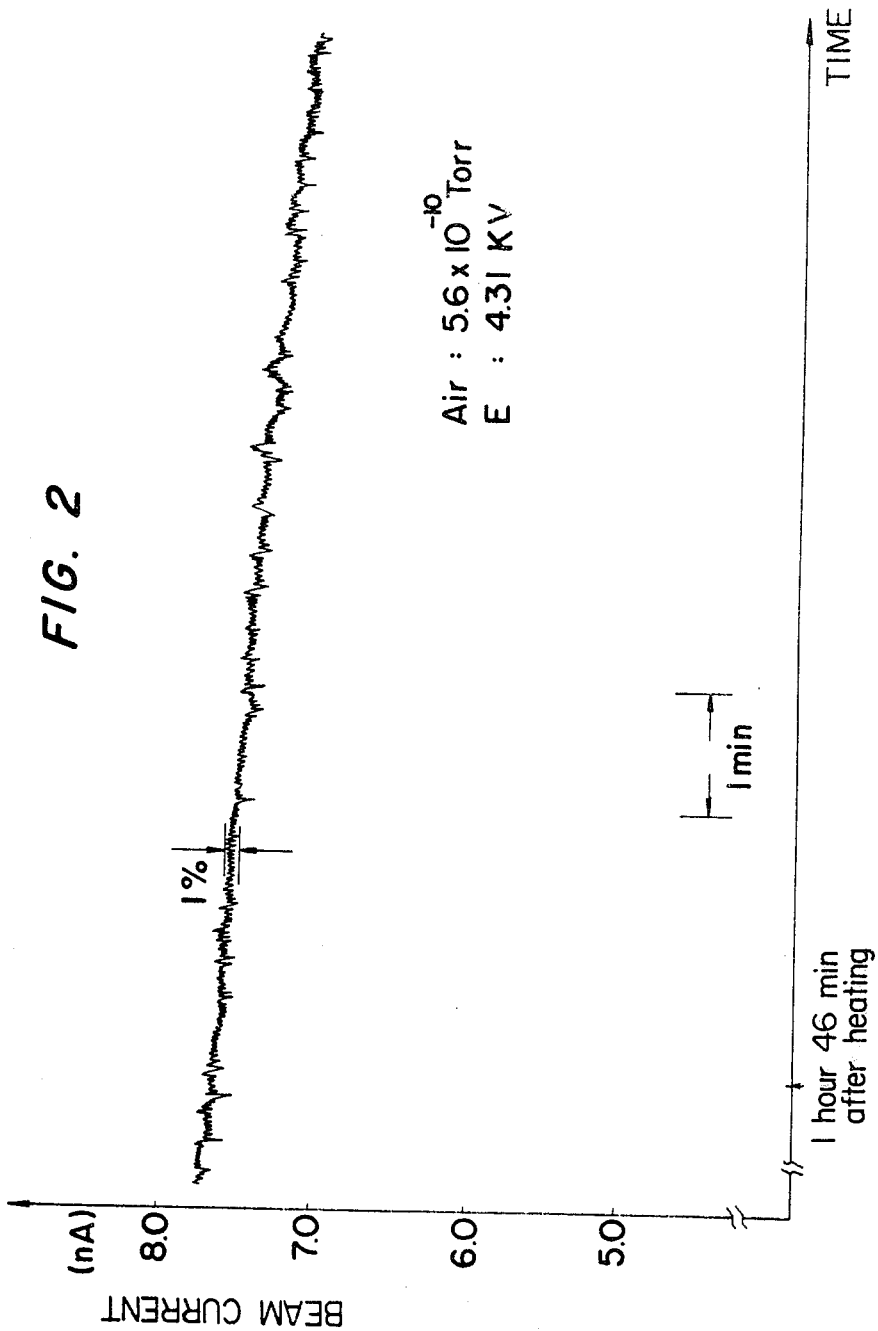

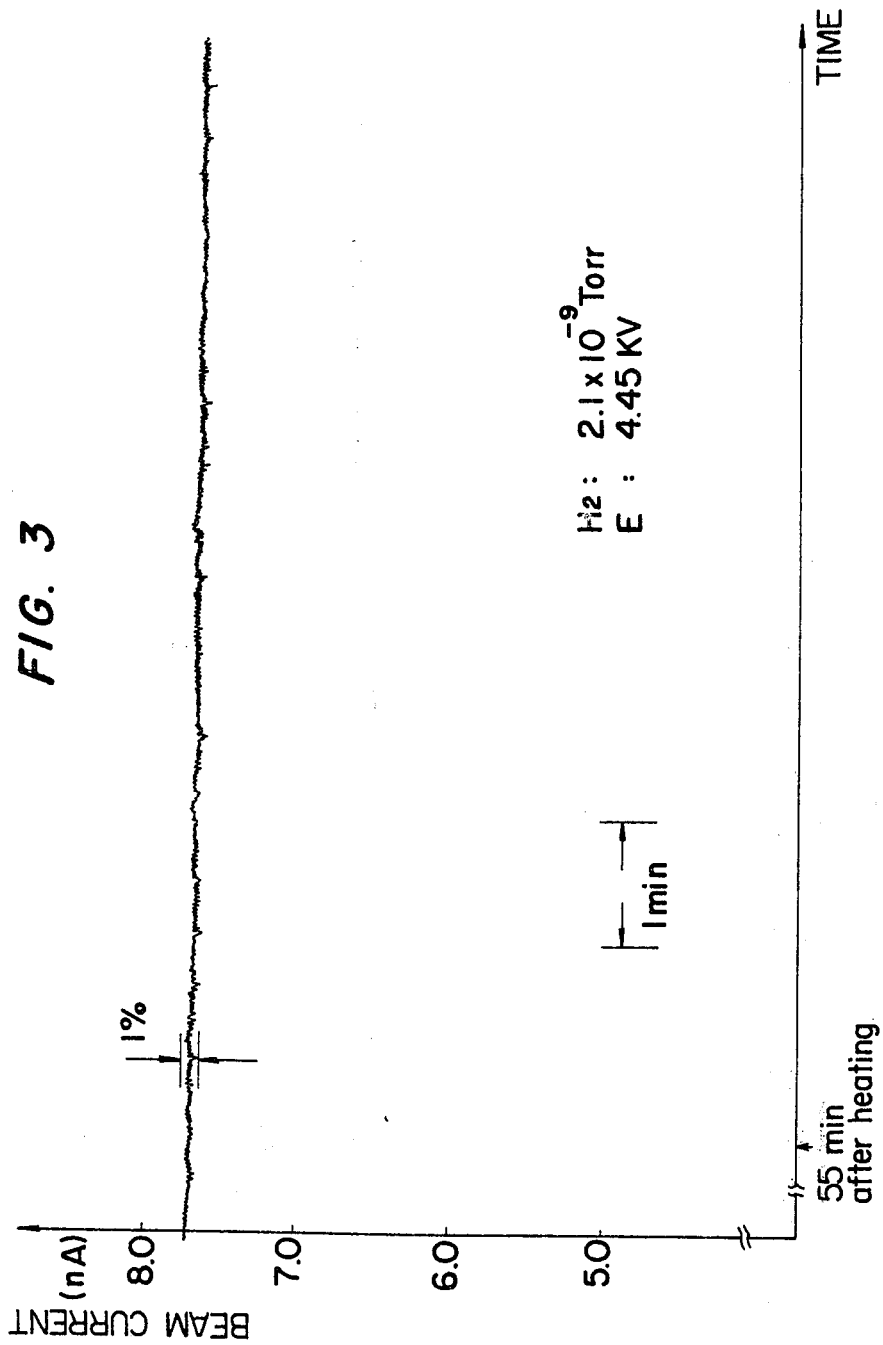

> 3,945,698

METHOD OF STABILIZING EMITTED ELECTRON BEAM IN FIELD EMISSION ELECTRON GUN

BACKGROUND OF THE INVENTION

1. Field of the Invention

This invention relates to a method of stabilizing the emitted electron beam current from the cathode of a field emission electron gun over a long period of time.

2. Description of the Prior Art

It is well known that electrons are field emitted from one surface of metallic or non-metallic materials when a strong electric field in excess of about $10^7$ volt/cm is applied to the surface. Although cathodes utilizing such a field emission effect are characteristic of luminances about $10^3$ times as high as cathodes employing the thermionic emission effect, the former cathodes have some difficult problems.

One of the problems is that the radius of curvature of the cathode tip is generally required to be made very small, for example, 1,000 to 3,000 A in order to facilitate application of such a strong electric field as mentioned above, and therefore field emission cathode materials are required which have a sufficiently high mechanical strength. This problem has been solved by using tungsten for the cathode material.

The most serious one of the problems encountered in electron guns employing a field emission cathode is a problem on how stable electron emission from the cathode can be sustained for a long time. Generally, in field emission electron guns a stable electron beam can be obtained only for a very short time since the density of the emitted electron beam tends to be changed in dependence on the conditions of the surface of the cathode. One of the causes of this is considered to be the absorption of residual gas in a vacuum atmosphere onto the cathode surface. Another cause is considered to result from the residual gas being ionized by the emitted electron beam and positive ions thus produced impinging on the cathode surface to cause turbulence of the surface conditions. Therefore, stabilization of electron emission from field emission cathodes will require an ambient atmosphere having a low pressure, generally a very high vacuum in excess of $10^{-11}$ Torr. However, in the case of using a field emission cathode in physics and chemistry instruments such as an electron microscope, it is very difficult to obtain such a high vacuum because the electron gun parts and various electro-optic system parts are included in the same evacuated vessel, and thus gas is emitted from these parts to the vacuum atmosphere. For this reason, it is normal practice to conduct field emission in an atmosphere of about $10^{-10}$ Torr. However, field emission in such a vacuum atmosphere has the disadvantage that the resultant field emitted electron beam current is not sufficiently stable, i.e., it shows fluctuations of a few percent.

SUMMARY OF THE INVENTION

It is a main object of this invention to provide a method of simply stabilizing the field emission current in field emission electron guns. It is another object of this invention to provide a stabilizing method wherein only a very short time will lapse before the electron beam current emitted from the field emission cathode reaches a stable fixed value.

According to this invention, these objects can be achieved by placing a field emission cathode under heat treatment of 2,000°C. to 3,000°C. in a hydrogen gas atmosphere of $1 \times 10^{-9}$ Torr to $5 \times 10^{-7}$ Torr.

The other objects, advantages and features of the invention will be apparent from the following detailed description when read in conjunction with the accompanying drawings.

BRIEF DESCRIPTION OF THE DRAWINGS

FIG. 2 is a graphic diagram showing the stability of current emitted from a field emission cathode of the prior art, and FIG. 3 is a graphic diagram showing the stability of current emitted from a field emission cathode after being subject to hydrogen gas treatment according to this invention.

PREFERRED EMBODIMENT OF THE INVENTION

Figure 1:
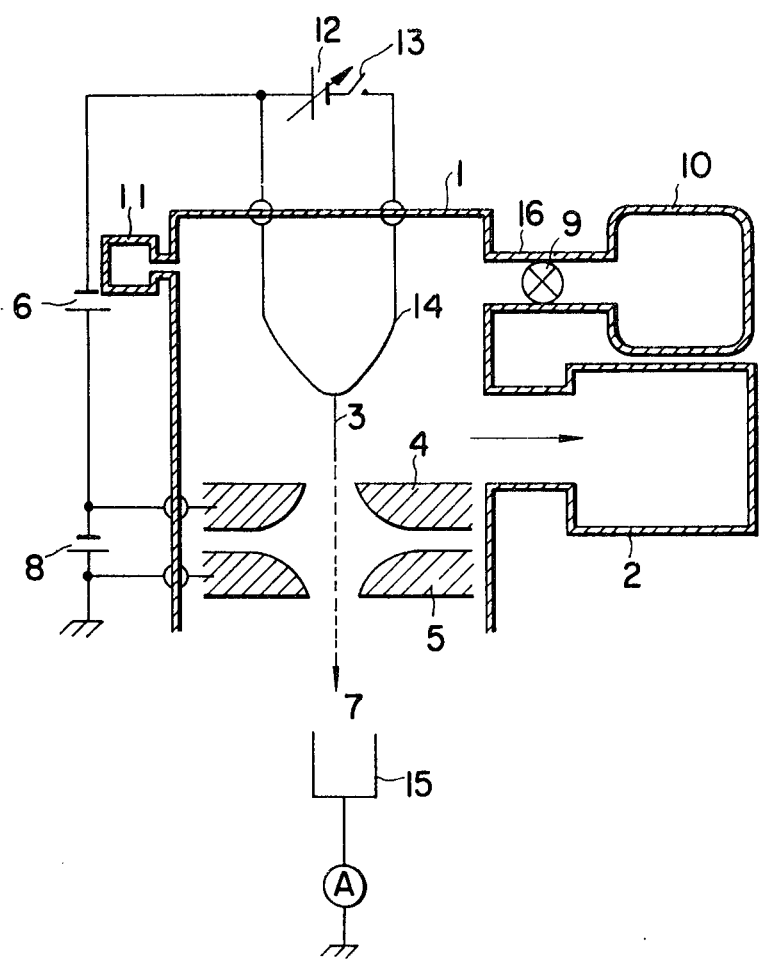
FIG. 1 is a schematic diagram of an exemplary field emission electron gun for use in explaining the method according to this invention.

Referring now to FIG. 1, a vacuum vessel 1 is evacuated by a vacuum pump 2 so that a vacuum atmosphere of, for example, about $2 \times 10^{-10}$ Torr may be maintained therein. Within the vacuum vessel 1 are arranged an elongated field emission cathode 3 made of tungsten and anode electrodes 4 and 5. An emitting voltage of, generally 3 to 5 KV is applied between the cathode 3 and the anode 4 from a D.C. power source 6. As a result of this, an electric field as concentrated on the tip of the cathode 3 is produced to cause electrons to be emitted from the cathode 3. The electron beam thus emitted is accelerated due to a voltage applied between the anode electrodes 4 and 5 by a D.C. power source 8 and extracted as a high speed electron beam.

A method of stabilizing the emitted electron beam in an electron gun of such structure will be described.

FIRST STEP

Highly pure hydrogen gas is introduced from a hydrogen gas bomb 10 into the vessel 1 by gradually opening a leak valve 9 which is inserted in a conduit 16 communicating with the vessel 1 and with the bomb 10. The partial pressure of hydrogen gas within the vessel 1 may be adjusted by a partial pressure measuring device 11 which is attached to the vessel 1. According to this invention, the partial pressure of hydrogen gas is selected to be in the range of $1 \times 10^{-9}$ to $5 \times 10^{-7}$ Torr. Experiments conducted by the inventors have shown that partial pressures of hydrogen gas lower than $1 \times 10^{-9}$ Torr are not contributable to stabilization of emitted electron beam because only a very small amount of hydrogen gas is contained within the vessel and that partial pressures higher than $5 \times 10^{-7}$ adversely influence stabilization of the emitted electron beam, as will be described hereinafter.

SECOND STEP

After hydrogen gas is introduced into the vacuum vessel 1 as mentioned above, a switch 13 which is connected between a cathode carrier 14 and a variable D.C. power source 12, is periodically switched on and off. The time interval between the switching-on and off is, for example, 0.1 to 3 seconds. In this way, electric current is intermittently supplied to the cathode carrier 14 to cause resistance heating of the carrier 14. Thus, the field emission cathode 3 is heated due to thermal conduction. According to this invention, the cathode 3 is preferably heated at a temperature in the range of 2,000°C. to 3,000°C. through such on-off operation of the switch 13. The reason why such range of heating temperature is selected is because, in the case of the temperature of the cathode 3 being lower than 2,000°C., it is difficult to remove impurities such as CO deposited on the cathode surface, and in the case where the temperature is above 3,000°C., tungsten material of the cathode 3 is melted. Such heat treatment leads to absorption of hydrogen gas to the surface of the cathode 3 and thus very high stabilization of the surface conditions which results in allowing a stable field emission current to be extracted from the cathode 3 for a long time. The reason why the partial pressure of hydrogen gas within the vacuum vessel 1 above $5 \times 10^{-7}$ Torr adversely influences stabilization of the emitted beam, as mentioned before, may be considered to be because hydrogen gas is strongly absorbed to the cathode surface, and further, hydrogen gas is weakly deposited thereon, which further hydrogen gas would be the cause of instability. After hydrogen gas has been introduced and heat treatment has been effected, its stabilization effect cannot be lost even if the hydrogen gas is evacuated.

Examples of experimental results will be described.

FIGS. 2 and 3 show the stabilities of electron beams emitted with a diverging angle of 111 m rad. from a portion of the field emission cathode 3 according to the prior art and this invention respectively, the electrons being detected by a collector 15 (see FIG. 1). Namely, FIG. 2 illustrates the stabilities of field emission from the cathode approximately 1 hour and 46 minutes after heating, wherein the cathode 3 is heated for a short time in a very high vacuum atmosphere of $5.6 \times 10^{-10}$ Torr according to the prior art and hereinafter a high voltage is applied between the cathode and the anode to cause field emission. In the case of an emitting voltage of 4.31 KV, the current detected by the collector 15 was 7 to 8 $\mu$A, and the stability was about 1 per cent.

FIG. 3 shows the stabilities of field emission from the cathode around 55 minutes after heating, wherein the cathode 3 is heated at about 2,000°C. in a hydrogen gas atmosphere of $2.1 \times 10^{-9}$ Torr according to this invention and then field emission is initiated. In the case of an emitting voltage of 4.45 KV, the current detected by the collector 15 was 7.5 $\mu$A, and the stability was about 0.2 per cent.

As will be apparent from these results, heat treatment of cathodes in a hydrogen gas atmosphere is very advantageous to stabilization of the field emission current from the cathodes. Furthermore, there is obtained another advantage that it will take only a very short time for the field emission current to reach a fixed value after heat treatment. Experiments have revealed that in the prior art the field emission current is not settled at any fixed value even after lapse of 2 hours; while, in a cathode heat treated in a hydrogen gas atmosphere of $1.4 \times 10^{-9}$ Torr according to this invention, field emission current reaches a fixed value after only 94 seconds, and in the case of $5.6 \times 10^{-7}$ Torr, it settles at a fixed value after 12 seconds.

Thus, it will be appreciated that according to this invention, the field emission current from cathodes can be stabilized earlier and its stability can be improved by a factor of 5 or more as compared with the prior art.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A method of stabilizing the emitted electron beam in a field emission electron gun comprising a first step of introducing an amount of hydrogen gas into a vacuum vessel containing a field emission cathode tip to a partial pressure of $5 \times 10^{-7}$ to $1 \times 10^{-9}$ Torr, and a second step of effecting heat treatment of the cathode tip.

2. The method as claimed in claim 1 wherein the cathode tip is intermittently heated at time intervals of 0.1 to 3 seconds.

3. The method as claimed in claim 1 wherein the cathode tip is heated at a temperature in the range of 2,000°C. to 3,000°C.

4. In a method of stabilizing an electron beam emitted from the cathode of a field emission electron gun, wherein said cathode is disposed in an ambient vacuum having a low pressure, the improvement comprising the steps of:

a. introducing hydrogen gas into the ambient vacuum in which said cathode is disposed to a partial pressure of $5 \times 10^{-7}$ to $1 \times 10^{-9}$ Torr; and b. heating said cathode at a temperature within a prescribed temperature range sufficient to remove impurities deposited on the cathode surface but insufficient to cause said cathode to melt, whereby hydrogen gas introduced in step (a) will be absorbed by said cathode and stabilize said electron beam emitted therefrom.

5. The improvement according to claim 4, wherein said prescribed temperature range is a range of 2,000°C to 3,000°C.

6. The improvement according to claim 5, wherein said cathode is made of tungsten.

7. The improvement according to claim 5, wherein step (b) comprises the step of intermittently supplying electric current to the cathode to cause resistance heating thereof.

8. The improvement according to claim 7, wherein said cathode is made of tungsten.

9. The improvement according to claim 5, wherein said impurities include carbon monoxide.

10. The improvement according to claim 8, wherein said impurities include carbon monoxide.

* * * * *